US011479030B2

(12) United States Patent
Kong et al.

(10) Patent No.: US 11,479,030 B2
(45) Date of Patent: Oct. 25, 2022

(54) APPARATUS FOR SUPPORTING DEBONDING AND DEBONDING METHOD USING THE SAME

(71) Applicant: CORNING INCORPORATED, Corning, NY (US)

(72) Inventors: Bokyung Kong, Hwaseong-si (KR); JooYoung Lee, Asan-si (KR)

(73) Assignee: Corning Incorporated, Corning, NY (US)

( * ) Notice: Subject to any disclaimer, the term of this patent is extended or adjusted under 35 U.S.C. 154(b) by 0 days.

(21) Appl. No.: 17/281,734

(22) PCT Filed: Oct. 1, 2019

(86) PCT No.: PCT/US2019/053960
§ 371 (c)(1),
(2) Date: Mar. 31, 2021

(87) PCT Pub. No.: WO2020/072422
PCT Pub. Date: Apr. 9, 2020

(65) Prior Publication Data
US 2021/0394505 A1 Dec. 23, 2021

(30) Foreign Application Priority Data
Oct. 4, 2018 (KR) .................. 10-2018-0118360

(51) Int. Cl.
*B32B 43/00* (2006.01)
(52) U.S. Cl.
CPC ...... *B32B 43/006* (2013.01); *B32B 2309/105* (2013.01); *B32B 2309/12* (2013.01);
(Continued)

(58) Field of Classification Search
CPC . B32B 38/10; B32B 43/006; Y10T 156/1132; Y10T 156/1944; Y10S 156/924; Y10S 156/937
See application file for complete search history.

(56) References Cited

U.S. PATENT DOCUMENTS 5,447,596 A * 9/1995 Hayase ............... H01L 21/6835
156/701
7,187,162 B2 * 3/2007 Kerdiles ................ G01N 19/04
156/765
(Continued)

FOREIGN PATENT DOCUMENTS

EP  1753284 A1  2/2007
JP  05-038647 A  2/1993
(Continued)

OTHER PUBLICATIONS

International Search Report and Written Opinion of the International Searching Authority; PCT/US2019/053960; dated Jan. 16, 2020, 6 pages; European Patent Office.
(Continued)

*Primary Examiner* — Philip C Tucker
*Assistant Examiner* — Nickolas R Harm

(57) ABSTRACT

An apparatus for supporting a process of debonding a carrier glass sheet and an ultrathin glass sheet. A suction plate includes a plurality of suction hole portions defining suction holes for suction-holding a glass laminate seated thereon and at least one recess portion defining at least one recess accommodating at least one device layer protruding from one surface of an ultrathin glass sheet of the glass laminate. A plurality of suction cups are fitted to the plurality of suction hole portions, respectively, such that the plurality of suction cups are elastically compressible, in response to contact pressure of the ultrathin glass sheet and the device layer. A vacuum pump is connected to the plurality of
(Continued)

suction hole portions to apply negative pressure to the plurality of suction hole portions. A controller controls the vacuum pump to adjust the negative pressure applied to the plurality of suction hole portions.

19 Claims, 6 Drawing Sheets

(52) U.S. Cl.
CPC ....... *B32B 2315/08* (2013.01); *Y10S 156/924* (2013.01); *Y10S 156/937* (2013.01); *Y10T 156/1132* (2015.01); *Y10T 156/1944* (2015.01)

(56) References Cited

U.S. PATENT DOCUMENTS

| | | | |
|---|---|---|---|
| 8,960,749 B2 | 2/2015 | Fukano et al. | |
| 2011/0198040 A1* | 8/2011 | Ebata | B65H 41/00 |
| | | | 156/750 |
| 2015/0217557 A1* | 8/2015 | Lee | B32B 43/006 |
| | | | 156/707 |
| 2015/0319893 A1* | 11/2015 | Ohno | B32B 43/006 |
| | | | 156/702 |
| 2016/0005637 A1 | 1/2016 | Woodard et al. | |
| 2016/0214367 A1* | 7/2016 | Choi | G02F 1/1303 |
| 2017/0113448 A1* | 4/2017 | Yang | B32B 38/1858 |
| 2017/0115476 A1* | 4/2017 | Ewoniuk | G02B 21/34 |
| 2018/0071771 A1 | 3/2018 | Kajino et al. | |
| 2018/0145255 A1* | 5/2018 | Yu | H01L 27/1266 |

FOREIGN PATENT DOCUMENTS

| | | |
|---|---|---|
| JP | 2007-185725 A | 7/2007 |
| JP | 2008-108593 A | 5/2008 |
| JP | 2014-179355 A | 9/2014 |
| JP | 2014-237545 A | 12/2014 |
| KR | 10-2015-0060506 A | 6/2015 |
| KR | 10-2016-0031637 A | 3/2016 |
| KR | 10-2017-0103056 A | 9/2017 |
| KR | 10-2017-0132558 A | 12/2017 |
| KR | 10-1829039 B1 | 3/2018 |
| WO | 2011/155443 A1 | 12/2011 |
| WO | 2018/093719 A1 | 5/2018 |

OTHER PUBLICATIONS

European Patent Application No. 19869207.1, Extended European Search Report dated Jun. 3, 2022; 8 pages European Patent Office.

* cited by examiner

[FIG. 1]
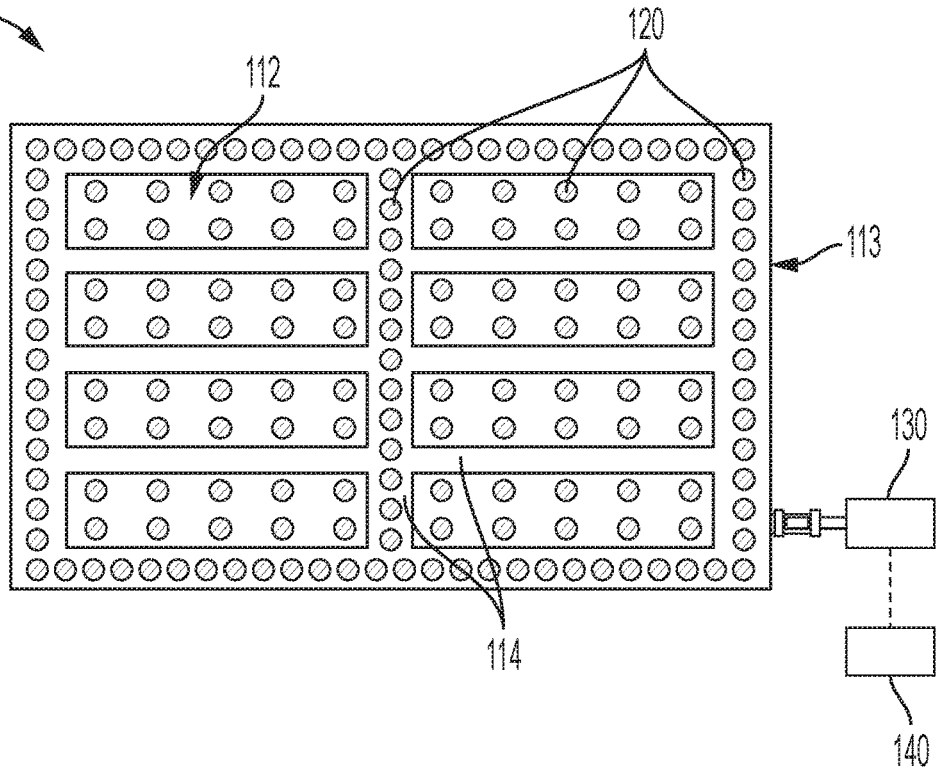
[FIG. 2]
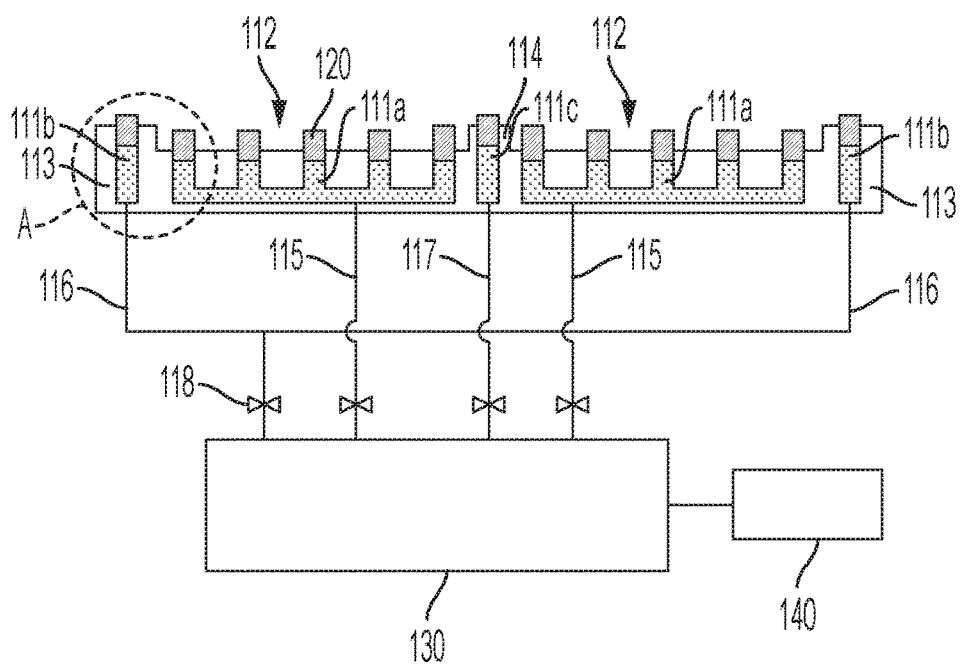

[FIG. 3]
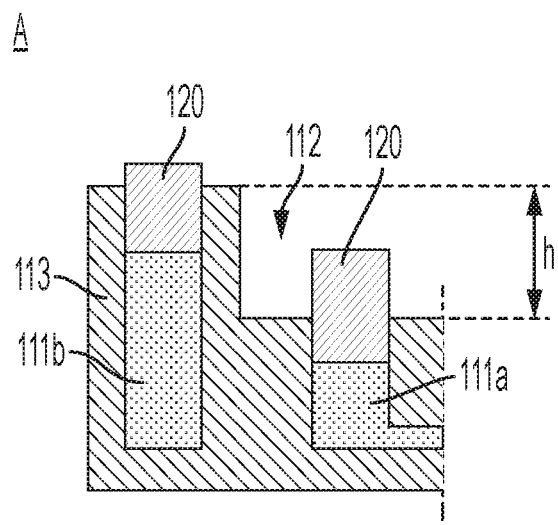
[FIG. 4]
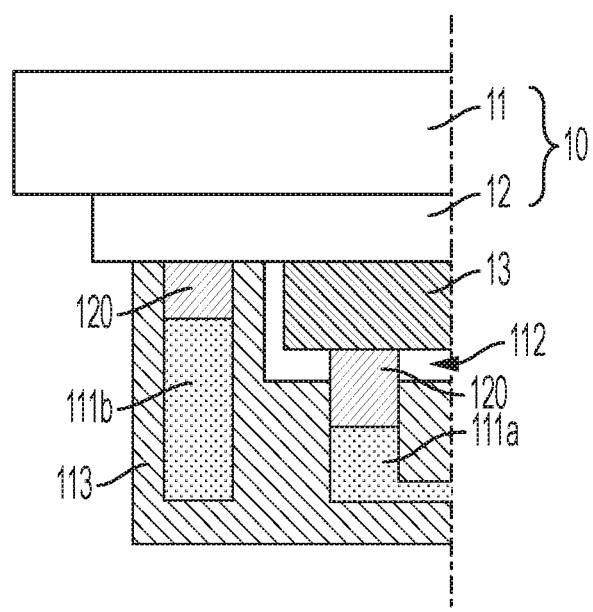

[FIG. 5]
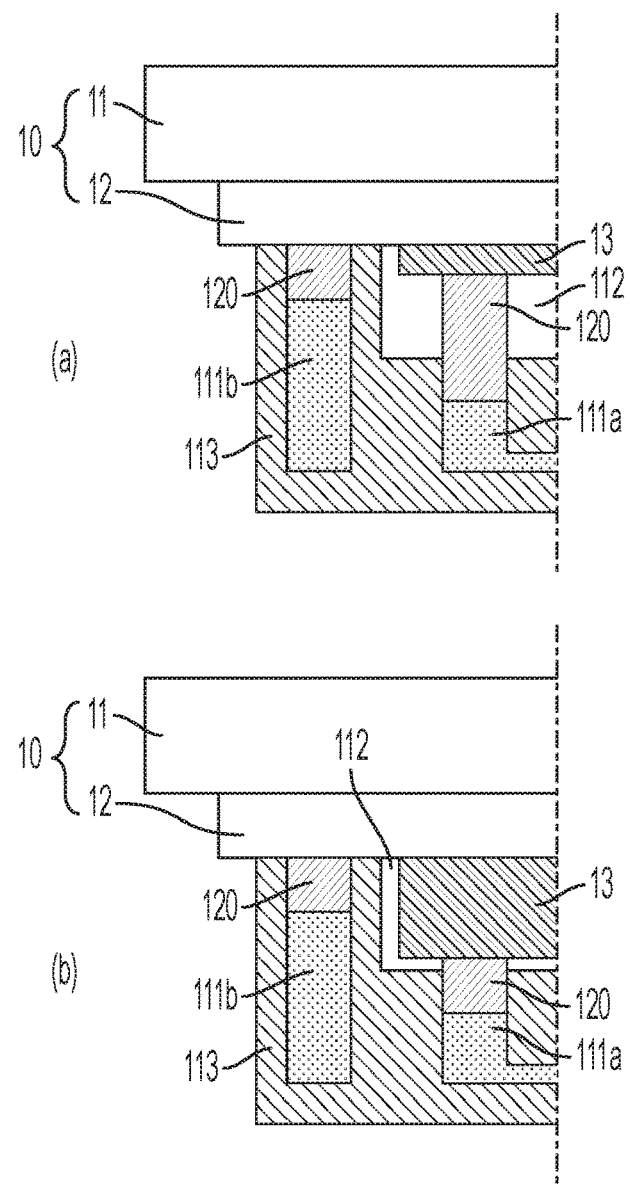
[FIG. 6]
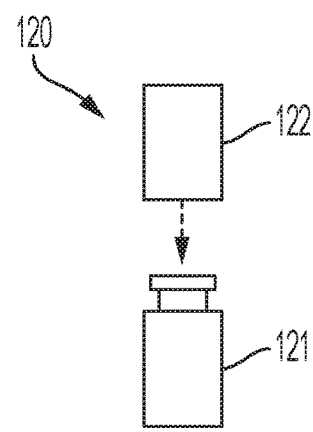

[FIG. 7]
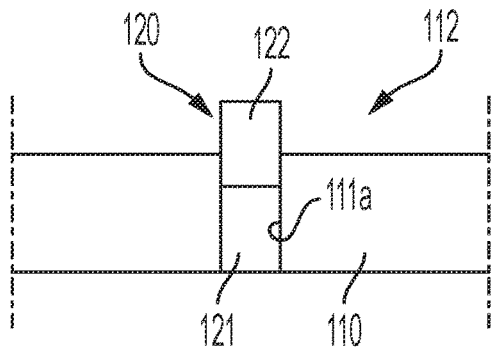
[FIG. 8]
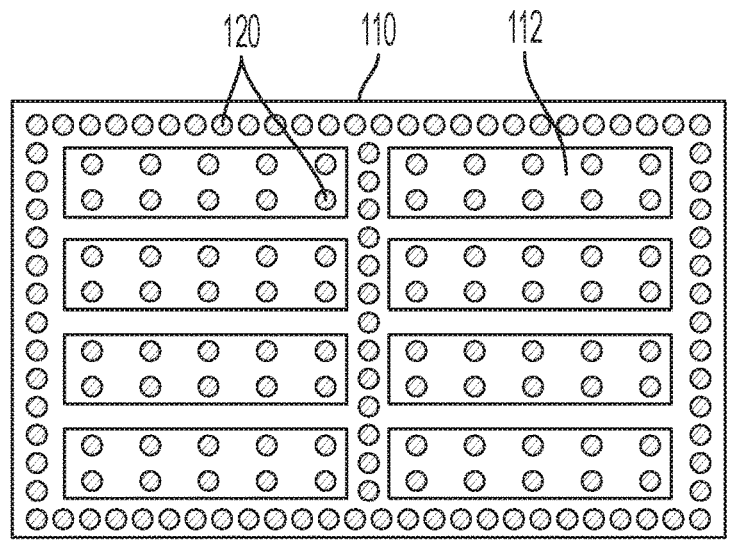
[FIG. 9]
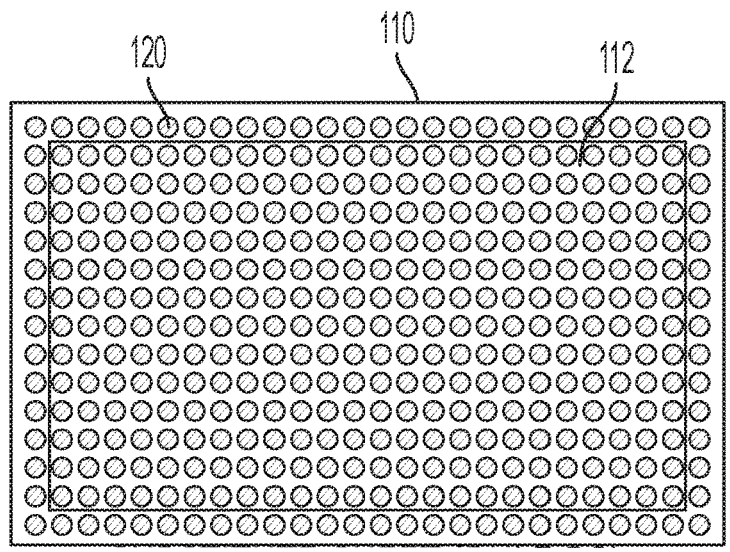

[FIG. 10]
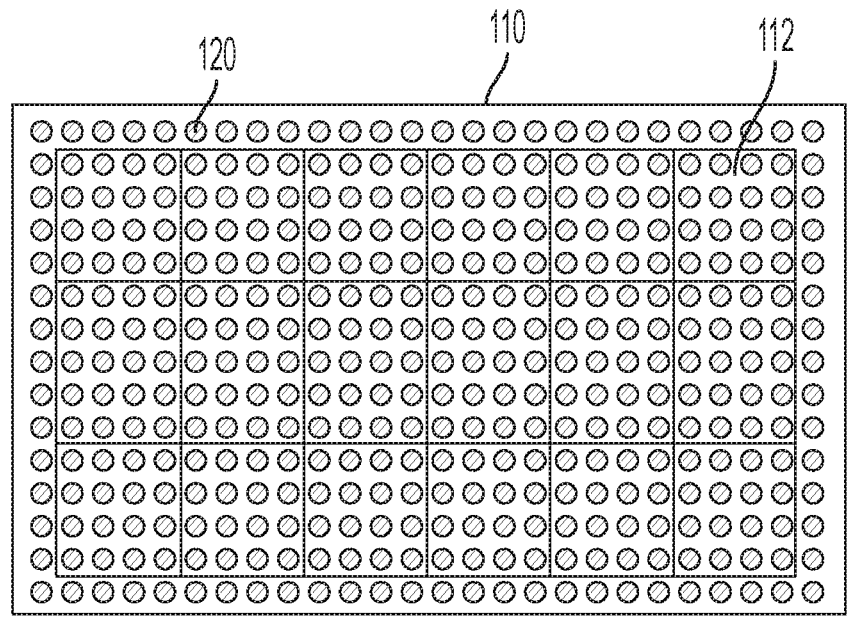
[FIG. 11]
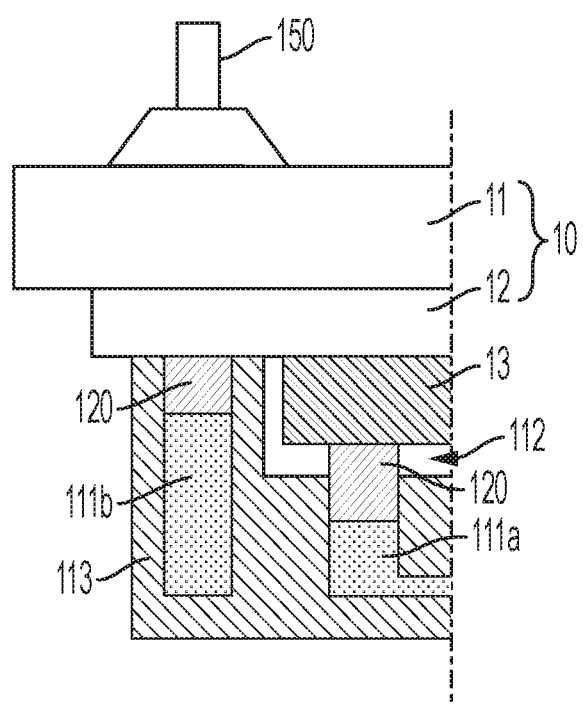

[FIG. 12]
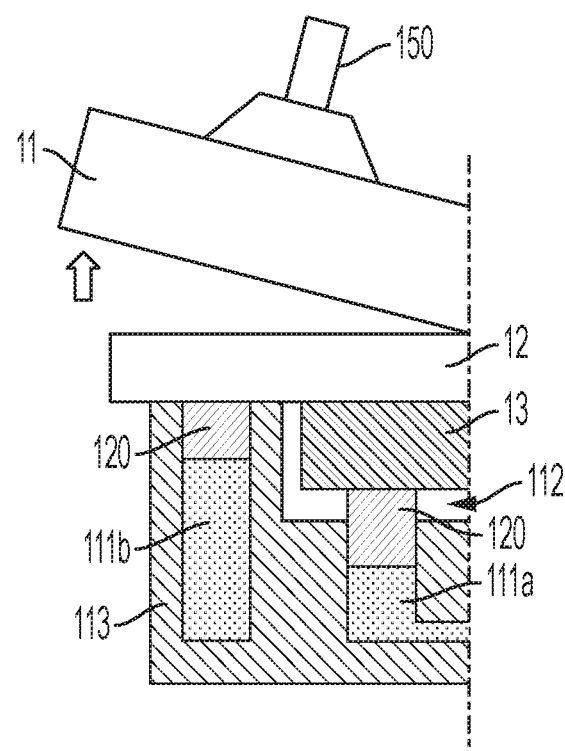
[FIG. 13]
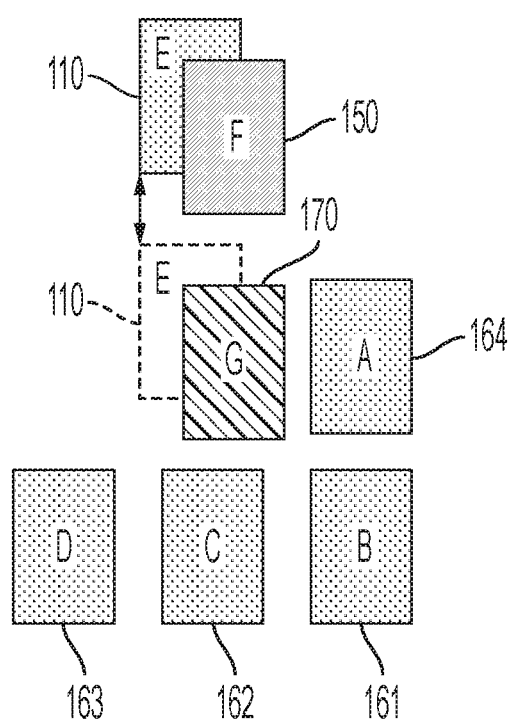

US 11,479,030 B2

APPARATUS FOR SUPPORTING DEBONDING AND DEBONDING METHOD USING THE SAME

BACKGROUND

This application claims the benefit of priority under 35 U.S.C. § 371 of International Application No. PCT/US2019/053960, filed on Oct. 1, 2019, which claims the benefit of priority under 35 U.S.C. § 119 of Korean Patent Application Serial No. 10-2018-0118360 filed on Oct. 4, 2018, the content of each of which is relied upon and incorporated herein by reference in its entirety.

FIELD

The present disclosure relates to an apparatus for supporting debonding and to a debonding method using the same. More particularly, the apparatus for supporting debonding and a debonding method using the same can reliably support a process of debonding an ultrathin glass sheet having a device layer protruding from one surface thereof and a carrier glass sheet bonded to the other surface of the ultrathin glass sheet, and can be used in common in processes of debonding ultrathin glass sheets, on each of which device layers having different thicknesses are provided.

DESCRIPTION OF RELATED ART

In general, ultrathin glass has a drawback of low applicability due to difficulties in handling, regardless of the availability thereof. Ultrathin glass sheets having a thickness of 20 µm to 250 µm may be easily scratched, even in the case that an insignificant impact is applied thereto, and such scratches may be the causes of damage or breakage of ultrathin glass sheets. In this regard, commonly, a thin glass sheet, harder than an ultrathin glass sheet and having a thickness of, for example, 0.5 mm or greater, is used as a backing to which the ultrathin glass sheet is bonded, and a resultant structure is handled as a single unit (sheet). For example, in the fabrication of a flexible organic light-emitting diode (OLED), light-emitting diode (LED) signage or the like, device layers are fabricated on such a unit by deposition, and a debonding process of debonding the ultrathin glass sheet from the thin glass sheet is ultimately performed.

In the case of a flexible OLED, an encapsulation film protrudes from the surface of the ultrathin glass sheet to at least a predetermined thickness. In the case of LED signage, when LED chips are mounted on an ultrathin glass sheet, the LED chips protrude from the surface of the ultrathin glass sheet to at least predetermined thicknesses.

Typically, after the above-described device layers are fabricated on a unit comprised of an ultrathin glass sheet and a thin glass sheet, vacuum devices, such as a suction plate and suction cups, are used to debond the ultrathin glass sheet and the thin glass sheet using a degree of vacuum force.

However, as described above, protrusions provided by the device layers on the ultrathin glass sheets may lower the degree of close contact between the ultrathin glass sheet and the vacuum devices, which is problematic. For example, a debonding process of the related art is undertaken by suction-holding one surface of an ultrathin glass sheet, and more particularly, one surface of an ultrathin glass sheet having a plurality of device layers fabricated thereon, to a surface of a flat suction plate, and then separating a thin glass sheet, bonded to the other surface of the ultrathin glass sheet, from the ultrathin glass sheet.

However, since the plurality of device layers protrude from portions on one surface of the ultrathin glass sheet, the plurality of protruding device layers may be in close contact with the suction plate, but portions of the one surface of the ultrathin glass sheet between the adjacent device layers and the peripheral portion of the one surface of the ultrathin glass sheet are not in close contact with the suction plate. Thus, the degree of close contact between the ultrathin glass sheet and the suction plate is reduced overall. In this situation, when the suction plate suction-holds the ultrathin glass sheet by applying negative pressure to the suction plate, the peripheral portion of the ultrathin glass sheet, not in close contact with the suction plate, may be attracted to the suction plate, and as a result, the ultrathin glass sheet may be bent or warped. In this case, it may be difficult to perform the debonding process. In addition, when the degree of bending or warping of the ultrathin glass sheet is increased, the ultrathin glass sheet may ultimately be damaged, thereby causing an adverse effect on the process yield.

RELATED ART DOCUMENT

Patent Document 1: Korean Patent Application Publication No. 10-2016-0031637 (Mar. 23, 2016)

SUMMARY

Various aspects of the present disclosure provide an apparatus for supporting debonding and a debonding method using the same, the apparatus and method being able to reliably support a process of debonding an ultrathin glass sheet having a device layer protruding from one surface thereof and a carrier glass sheet bonded to the other surface of the ultrathin glass sheet, and can be used in common in processes of debonding ultrathin glass sheets, on each of which device layers having different thicknesses are provided.

According to an aspect, provided is an apparatus for supporting a process of debonding a carrier glass sheet and an ultrathin glass sheet, bonded as a single glass laminate. The apparatus includes: a suction plate including a plurality of suction hole portions defining suction holes for suction-holding a glass laminate seated thereon and at least one recess portion defining at least one recess accommodating at least one device layer protruding from one surface of an ultrathin glass sheet of the glass laminate; a plurality of suction cups fitted to the plurality of suction hole portions, respectively, such that the plurality of suction cups are elastically compressible, in response to contact pressure of the ultrathin glass sheet and the device layer; a vacuum pump connected to the plurality of suction hole portions to apply negative pressure to the plurality of suction hole portions; and a controller controlling the vacuum pump to adjust the negative pressure applied to the plurality of suction hole portions.

The recess portion may be deeper than the thickness of the device layer.

The at least one recess portion may be disposed on a surface of the suction plate on which the glass laminate is seated, and the suction plate may further include a peripheral portion surrounding the at least one recess portion on the surface of the suction plate on which the glass laminated is seated.

The at least one recess portion may include a plurality of recess portions, the plurality of recess portions disposed on a surface of the suction plate on which the glass laminate is seated. The suction plate may further include a peripheral portion surrounding the plurality of recess portions, and a rib disposed between adjacent recess portions among the plurality of recess portions, on the surface of the suction plate on which the glass laminate is seated.

The suction plate may include: a first flow path by which suction hole portions, among the plurality of suction hole portions provided in each recess portion among the plurality of recess portions, are connected, the first flow path being connected to the vacuum pump; a second flow path by which suction hole portions among the plurality of suction hole portions provided in the peripheral portion are connected, the second flow path being connected to the vacuum pump; and a third flow path by which suction hole portions among the plurality of suction hole portions provided in the rib are connected, the third flow path being connected to the vacuum pump.

The suction plate may further include control valves disposed on the first flow path, the second flow path, and the third flow path, respectively.

The first flow path may include a plurality of first flow paths provided in the plurality of recess portions, respectively, the plurality of first flow paths being controlled individually.

Each of the plurality of suction cups may include: a fixing portion fastened to an inner circumferential surface of a corresponding suction hole portion among the plurality of suction hole portions, with a first hole portion extending in a longitudinal direction of the fixing hole portion; and an operating portion coupled to a top end of the fixing portion to protrude from a top surface of the suction plate, with a second hole portion extending in a longitudinal direction of the operating portion to communicate with the first hole portion, the operating portion being elastically compressible in response to a contact pressure of the ultrathin glass sheet or the device layer.

An outer circumferential surface of the fixing portion may be screw-engaged with the inner circumferential surface of the corresponding suction hole portion.

The operating portion may be a bellows.

The glass laminate may be configured such that a carrier glass sheet which is relatively thicker and wider than the ultrathin glass sheet is bonded to the ultrathin glass sheet while surrounding the ultrathin glass sheet.

A thickness of the ultrathin glass sheet may range from 20 μm to 250 μm.

The apparatus may further include at least one suction cap disposed on a carrier glass sheet of the glass laminate after the glass laminate is seated on the suction plate.

The at least one suction cap may be connected to the vacuum pump controlled by the controller to suction-hold the carrier glass sheet using negative pressure applied by the vacuum pump.

The at least one suction cap may be configured to be movable in a top-bottom direction to lift the carrier glass sheet under control of the controller, thereby detaching the carrier glass sheet from the ultrathin glass sheet.

The at least one suction cap may include a plurality of suction caps. The controller may control the vacuum pump to apply negative pressure to the plurality of suction caps sequentially in a debonding propagation direction.

The suction plate may be movable in a horizontal direction.

The suction plate may move below the at least one suction cap after the glass laminate is seated thereon and return to an initial position after debonding is finished.

The apparatus may further include first to fourth trays disposed around the suction plate, wherein the glass laminate to be debonded is placed in the first tray, the debonded ultrathin glass sheet is placed in the second tray, the debonded carrier glass sheet is placed in the third tray, and a plurality of paper sheets are loaded in the fourth tray before being supplied to the first to third trays.

The apparatus may further include a gantry unit traveling around the suction plate and the first to fourth trays to transport the glass laminate, the debonded ultrathin glass sheet, the debonded carrier glass sheet, and the plurality of paper sheets.

Also provided is a method of debonding a carrier glass sheet and an ultrathin glass sheet, bonded as a single glass laminate. The method may include: locating a glass laminate in position on a top surface of the suction plate of the above-described apparatus; applying negative pressure to the suction plate to suction-hold the glass laminate located on the top surface of the suction plate; and debonding a carrier glass sheet of the glass laminate from an ultrathin glass sheet of the glass laminate, while the suction plate is suction-holding the ultrathin glass sheet.

The glass laminate may be located in position such that the carrier glass sheet is not in contact with the suction plate.

Debonding the carrier glass sheet from the ultrathin glass sheet may include suction-holding the carrier glass sheet and lifting the carrier glass sheet sequentially from one side to the other side.

The suction-holding the carrier glass sheet may include suction-holding portions of the carrier glass sheet sequentially in a debonding propagation direction.

According to exemplary embodiments, the suction plate having the recesses for accommodating the device layers protruding from one surface of the ultrathin glass sheet is provided. Accordingly, it may be possible to reliably support the process of debonding the ultrathin glass sheet and the carrier glass sheet bonded to the other surface of the ultrathin glass sheet.

Specifically, according to exemplary embodiments, in the debonding process, the difference in the degree of close contact between one surface of the ultrathin glass sheet and the suction plate can be minimized. More specifically, the difference between the degree of close contact of one area of the ultrathin glass sheet, on which the device layers are provided, with the suction plate, and the degree of close contact of the other area of the ultrathin glass sheet, on which no device layers are provided, with the suction plate, can be minimized. This can consequently reduce the probability that the ultrathin glass sheet may be bent, and thus damaged, during the debonding process using negative pressure or vacuum pressure, thereby improving process yield.

In addition, according to exemplary embodiments, the plurality of suction holes are provided in the entirety of the recesses and the peripheral portion surrounding the recesses in the top surface of the suction plate facing the ultrathin glass sheet, such that the debonding process can be reliably supported.

Furthermore, according to exemplary embodiments, the suction cups elastically compressible in the longitudinal direction are disposed in the suction holes provided in the recesses of the suction plate. This configuration can be used in common for the debonding process for other ultrathin glass sheets, on each of which the device layers having different thicknesses are provided.

In addition, according to exemplary embodiments, the suction cups elastically compressible in the longitudinal direction are disposed in the suction holes not only in the recesses but also in the peripheral portion and the ribs, such that damage to the ultrathin glass plate by contact with the suction plate formed from metal can be prevented.

The methods and apparatuses of the present disclosure have other features and advantages that will be apparent from or that are set forth in greater detail in the accompanying drawings which are incorporated herein, and in the following Detailed Description, which together serve to explain certain principles of the present disclosure.

BRIEF DESCRIPTION OF THE DRAWINGS

FIG. 1 is a plan view illustrating an apparatus for supporting debonding according to an exemplary embodiment;

FIG. 2 is a cross-sectional view of FIG. 1;

FIG. 3 is an enlarged view of portion "A" in FIG. 2;

FIG. 4 is a schematic view illustrating a glass laminate suction-held by the apparatus for supporting debonding according the exemplary embodiment;

FIGS. 5A and 5B are schematic views comparing shapes in which glass laminates, on which device layers having different thicknesses are provided, are suction-held by the apparatus for supporting debonding according the exemplary embodiment;

FIG. 6 is a schematic view illustrating a connection structure of the suction cup in the apparatus for supporting debonding according the exemplary embodiment;

FIG. 7 is a schematic view in which the suction cup is fitted to the suction hole in the apparatus for supporting debonding according the exemplary embodiment;

FIGS. 8, 9, and 10 are plan views illustrating recesses having different structures in apparatuses for supporting debonding according exemplary embodiments;

FIG. 11 is a schematic view illustrating an application of the suction cap in an apparatus for supporting debonding according an exemplary embodiment;

FIG. 12 is a schematic view in which the glass laminate is debonded using the apparatus for supporting debonding according the exemplary embodiment; and FIG. 13 is a configuration view schematically illustrating an apparatus for supporting debonding according an exemplary embodiment.

DETAILED DESCRIPTION

Hereinafter, an apparatus for supporting debonding and a debonding method using the same will be described with reference to the accompanying drawings.

In the following description, detailed descriptions of known functions and components incorporated in the present disclosure will be omitted in the case in which the subject matter of the present disclosure is rendered unclear by the inclusion thereof.

As illustrated in FIGS. 1 to 4, an apparatus for supporting debonding according to an exemplary embodiment is an apparatus for supporting a process of debonding an ultrathin glass sheet 12 from a carrier glass sheet 11 after fabrication of device layers 13 on one surface of the ultrathin glass sheet 12, in which the ultrathin glass sheet 12 is bonded to the carrier glass sheet 11 to provide a single glass laminate 10 in order to facilitate the process of fabricating the device layers 13, which will be converted into a flexible organic light-emitting diode (OLED), light-emitting diode (LED) signage, or the like.

In this regard, the apparatus for supporting debonding according to the exemplary embodiment includes a suction plate 110, a plurality of suction cups 120, a vacuum pump 130, and a controller 140.

The suction plate 110 is a table configured to suction-hold the glass laminate 10 seated thereon. The glass laminate 10 is fabricated to support the ultrathin glass sheet 12, since handling thereof may be difficult when transporting the ultrathin glass sheet 12 or fabricating the device layers 13 on the ultrathin glass sheet 12. The glass laminate 10 is fabricated by bonding the ultrathin glass sheet 12 to the carrier glass sheet 11. That is, the glass laminate 10 is fabricated to ensure the process of fabricating the device layers 13 is reliably performed while the ultrathin glass sheet 12 is being supported by the carrier glass sheet 11.

The glass laminate 10 is provided by bonding the carrier glass sheet 11 and the ultrathin glass sheet 12 having different thicknesses and areas. A single glass laminate 10 is provided by bonding the carrier glass sheet 11 and the ultrathin glass sheet 12 such that the wider and thicker carrier glass sheet 11 surrounds the ultrathin glass sheet 12, i.e. the carrier glass sheet 11 extends beyond each of the four sides of the ultrathin glass sheet 12. Then, a plurality of device layers 13 are fabricated on the glass laminate 10 by coating the ultrathin glass sheet 12 with, for example, indium tin oxide (ITO), which will form an electrode layer, patterning the ITO film, coating the patterned ITO film with an insulating film, patterning the insulating film into a plurality of insulating layers, depositing organic light-emitting layers on the patterned insulating layers, respectively, and encapsulating the resultant structures with an encapsulation film. Here, the plurality of device layers 13 protrude from the surface of the ultrathin glass sheet 12 by at least a predetermined thickness.

When fabrication of the plurality of device layers 13 is completed, the ultrathin glass sheet 12, on which the plurality of device layers 13 are fabricated, must be debonded from the carrier glass sheet 11 for subsequent processing, such as panel cutting.

According to the exemplary embodiment, the ultrathin glass sheet 12 may refer to a glass sheet having a thickness of 20 μm to 250 μm. As described above, as the carrier glass sheet 11, a glass sheet wider and thicker than the ultrathin glass sheet 12 may be used.

For the debonding process, the glass laminate 10 is seated on and then suction-held by the suction plate 110. In this regard, the suction plate 110 includes a plurality of suction hole portions defining a plurality of suction holes 111a, 111b, and 111c to suction-hold the glass laminate 10 when the glass laminate 10 is brought into contact therewith.

According to the exemplary embodiment, the top surface of the suction plate 110 is comprised of recess portions defining recesses 112 and a peripheral portion 113 surrounding the recess portions defining the recesses 112. According to the exemplary embodiment, a plurality of suction holes 111a are provided in each of the recesses 112. In addition, a plurality of suction holes 111b are also provided in the peripheral portion 113. As illustrated in FIGS. 1 and 8, the concentration of the plurality of suction holes 111a provided in the recesses 112 may be lower than the concentration of the plurality of suction holes 111b provided in the peripheral portion 113. This can cause suction force generated by the recesses 112 to be lower than suction force generated by the peripheral portion 113, thereby preventing the device layers 13 accommodated in the recesses 112 from becoming defective. However, as illustrated in FIGS. 9 and 10, the concentration of the plurality of suction holes 111a provided in the recesses 112 may be the same as the concentration of the plurality of suction holes 111b provided in the peripheral portion 113.

As described above, the concentration of the plurality of suction holes 111a or 111b provided in the recesses 112 or the peripheral portion 113 may vary, depending on the conditions or environment of the debonding process. Thus, according to the exemplary embodiment, the concentration of the plurality of suction holes 111a or 111b provided in the recesses 112 or the peripheral portion 113 is not specifically limited.

Ribs 114 may be provided on the top surface of the suction plate 110, between the adjacent recesses 112, to define the recesses 112 together with the peripheral portion 113. However, as illustrated in FIG. 9, when a single device layer 13 is provided on one surface of the ultrathin glass sheet 12, the ribs 114 may be omitted.

In addition, as illustrated in FIGS. 1 and 2, a plurality of suction holes 111c may be provided in the ribs 114. However, as illustrated in FIG. 10, when the distances between the plurality of device layers 13, provided on one surface of the ultrathin glass sheet 12, are small and the widths of the ribs 114 are narrow, the suction holes 111c may be omitted.

As described above, according to the exemplary embodiment, the debonding process can be reliably supported, since the plurality of suction holes 111a, 111b, and 111c are provided in the entirety of the recesses 112 of the suction plate 110, the peripheral portion 113 surrounding the recesses 112, and the ribs 114.

In the debonding process according to the exemplary embodiment, the glass laminate 10 is seated on the top surface of the ultrathin glass sheet 12 such that one surface of the ultrathin glass sheet 12, from which the device layers 13 protrude, faces the top surface of the suction plate 110. That is, the plurality of suction holes 111a, 111b, and 111c of the suction plate 110 hold the one surface of the ultrathin glass sheet 12 and the device layers 13 via suction. Here, the recesses 112 are areas of the top surface of the suction plate 110 accommodating the device layers 13, with the number of the recesses 112 being the same as the number of device layers 13 provided on the one surface of the ultrathin glass sheet 12.

According to the exemplary embodiment, the recesses 112 accommodating the device layers 13 are provided to be deeper than the thicknesses of the device layers 13. When the recesses 112 are provided in the top surface of the suction plate 110 to accommodate the device layers 13 protruding from one surface of the ultrathin glass sheet 12, the process of debonding the ultrathin glass sheet 12 and the carrier glass sheet 11 bonded to the other surface of the ultrathin glass sheet 12 can be reliably supported.

That is, in the debonding process, the difference in the degree of close contact between one surface of the ultrathin glass sheet 12 and the top surface of the suction plate 110 can be minimized. More specifically, the difference between the degree of close contact of one area of the ultrathin glass sheet 12, on which the device layers 13 are provided, with the top surface of the suction plate 110, and the degree of close contact of the other area of the ultrathin glass sheet 12, on which no device layers are provided, with the top surface of the suction plate 110, can be minimized. This can consequently reduce the probability that the ultrathin glass sheet 12 may be bent, and thus damaged, during the debonding process using negative pressure or vacuum pressure, thereby improving process yield.

In addition, the suction plate 110 according to the exemplary embodiment may further include first flow paths 115, second flow paths 116, and third flow paths 117.

The first flow paths 115 are provided between the plurality of suction holes 111a in the recesses 112 and the vacuum pump 130 to connect the plurality of suction holes 111a and the vacuum pump 130. The first flow paths 115 may connect the plurality of suction holes 111a provided in the recesses 112 to each other. Accordingly, negative pressure applied by the vacuum pump 130 may be distributed to the plurality of suction holes 111a through the first flow paths 115, thereby generating suction force. According to the exemplary embodiment, the plurality of first flow paths 115 may be provided in the plurality of recesses 112, respectively. In this case, each of the plurality of first flow paths 115 provided in the plurality of recesses 112 may be controlled individually.

The second flow paths 116 are provided between the plurality of suction holes 115b provided in the peripheral portion 113 and the vacuum pump 130 to connect the plurality of suction holes 115b and the vacuum pump 130. The second flow paths 116 may connect the plurality of suction holes 111b in the peripheral portion 113 to each other. Accordingly, negative pressure applied by the vacuum pump 130 may be distributed to the plurality of suction holes 111b through the second flow paths 116, thereby generating suction force.

The third flow paths 117 are provided between the plurality of suction holes 111c provided in the ribs 114 and the vacuum pump 130 to connect the plurality of suction holes 111c and the vacuum pump 130. The third flow paths 117 may connect the plurality of suction holes 111c provided in the ribs 114 to each other. Accordingly, negative pressure applied by the vacuum pump 130 may be distributed to the plurality of suction holes 111c through the third flow paths 117, thereby generating suction force.

According to the exemplary embodiment, control valves 118 may be provided for the first flow paths 115, the second flow paths 116, and the third flow paths 117, respectively. Due to this configuration, even in the case that negative pressure is applied to the first flow paths 115, the second flow paths 116, and the third flow paths 117 by the vacuum pump 130, it is possible to prevent suction force from being generated in the plurality of suction holes 111a provided in the recesses 112, in the plurality of suction holes 111b provided in the peripheral portion 113, or in the plurality of suction holes 111c provided in the ribs 114. According to the exemplary embodiment, it is possible to adjust suction force according to the area of the top surface of the suction plate 110, depending on the conditions or environment of the debonding process, by controlling the control valves 118 provided for the first flow paths 115, the second flow paths 116, and the third flow paths 117, respectively.

The suction cups 120 are fitted to the plurality of suction holes 111a, 111b, and 111c, respectively. The suction cups 120 are configured to be elastically compressible in the longitudinal direction, in response to contact pressure of the ultrathin glass sheet 12 and the device layers 13. Specifically, the suction cups 120, fitted to the plurality of suction holes 111a in the recesses 112, are in contact with the device layers 13 and are elastically compressed by the contact pressure of the device layers 13. In addition, the suction cups 120, fitted to the plurality of suction holes 111b and 111c, are in direct contact with the ultrathin glass sheet 12 and are elastically compressed by the contact pressure of the ultrathin glass sheet 12.

As illustrated in FIGS. 5A and 5B, when the suction cups 120 elastically compressible in the longitudinal direction are fitted to the suction holes 111a of the recesses 112, this configuration can be used in common for the debonding process for other ultrathin glass sheets 12 on each of which device layers 13 having different thicknesses are provided.

In addition, the suction cups 120, fitted to the plurality of suction holes 111b and 111c provided in the peripheral portion 113 and the ribs 114, serve to protect the ultrathin glass sheet 12 such that one surface of the ultrathin glass sheet 12 is not locally damaged by direct contact with the top surface of the suction plate 110 formed from metal.

As illustrated in FIGS. 6 and 7, according to the exemplary embodiment, each of the suction cups 120 may include a fixing portion 121 and an operating portion 122.

The fixing portion 121 is fastened to the inner circumferential surface of the corresponding suction hole among the suction holes 111a, 111b, and 111c. The outer circumferential surface of the fixing portion 121 may be screw-engaged with the inner circumferential surface of the corresponding suction hole 111a, 111b, or 111c. The fixing portion 121 may be provided with a first hole (not shown) extending in the longitudinal direction thereof. According to the exemplary embodiment, the fixing portion 121 may be formed from metal.

The operating portion 122 may be provided as a bellows. The operating portion 122 may be fitted around the top end of the fixing portion 121. Due to this configuration, the operating portion 122 may protrude from the top surface of the suction plate 110. In addition, the operation portion 122 is provided with a second hole (not shown) extending in the longitudinal direction of the operation portion 122 to communicate with the first hole (not shown) provided in the fixing portion 121.

According to the exemplary embodiment, the operation portion 122 may be substantially in contact or close contact with the ultrathin glass sheet 12 and the device layers 13. According to the exemplary embodiment, the operation portion 122 is elastically compressed, in response to the contact pressure of the ultrathin glass sheet 12 or the device layers 13. As the operation portion 122 is compressed or returned as described above, the apparatus for supporting debonding according to the exemplary embodiment can be used in common for the debonding process for ultrathin glass sheets 12 on each of which the device layers 13 having different thicknesses are provided.

The vacuum pump 130 is connected to the suction plate 110, and more particularly, to the plurality of suction holes 111a, 111b, and 111c, provided in the recesses 112, the peripheral portion 113, and the ribs 114 defined in the top surface of the suction plate 110, via the first flow paths 115, the second flow paths 116, and the third flow paths 117, so as to apply negative pressure to the plurality of suction holes 111a, 111b, and 111c. More specifically, since the suction cups 120 are fitted to the plurality of suction holes 111a, 111b, and 111c, respectively, the vacuum pump 130 substantially applies negative pressure to the suction cups 120 fitted to the plurality of suction holes 111a, 111b, and 111c.

Such negative pressure applied by the vacuum pump 130 generates suction force in the plurality of suction cups 120 in a corresponding area. As a result, the ultrathin glass sheet 12 or the device layers 13 remaining in contact with the plurality of suction cups 120 for the debonding process are suction-held by the suction cups 120. Consequently, the glass laminate 10 seated on the top surface of the suction plate 110 can be debonded.

The controller 140 adjusts negative pressure applied to the plurality of suction holes 111a, 111b, and 111c by controlling the vacuum pump 130. According to the exemplary embodiment, the controller 140 may control the vacuum pump 130 to apply uniform negative pressure to the plurality of suction holes 111a, 111b, and 111c.

According to the exemplary embodiment, even in the case that uniform negative pressure is applied to the plurality of suction holes 111a provided in the recesses 112 and the plurality of suction holes 111b provided in the peripheral portion 113, different levels of suction force may be generated in the recesses 112 and the peripheral portion 113, since the concentration of the plurality of suction holes 111a in the recesses 112 may be different from the concentration of the plurality of suction holes 111b in the peripheral portion 113. Specifically, even in the case that uniform negative pressure is applied, a relatively low amount of suction force may be generated in the recesses 112, in which the device layers 13 are provided, while a relatively high amount of suction force may be generated in the peripheral portion 113, in which no device layers 13 are provided, and which is in contract with one surface of the ultrathin glass sheet 12. According to the exemplary embodiment, the concentration of the suction holes is set to vary according to the area, such that different levels of suction force are generated according to the areas. However, this is only illustrative, and the concentration of the suction holes according to the area may be adjusted to be the same or different depending on the conditions or environment of the debonding process. Likewise, the sizes of the suction holes may be properly adjusted depending on the conditions or environment of the debonding process.

As illustrated in FIGS. 11 and 12, the apparatus for supporting debonding according to the exemplary embodiment may further include at least one suction cap 150. The suction cap 150 is placed on the carrier glass sheet 11 when the glass laminate 10 is seated on the top surface of the suction plate 110. The suction cap 150 is connected to the vacuum pump 130 controlled by the controller 140, and suction-holds the top portion of the carrier glass sheet 11 using negative pressure applied by the vacuum pump 130.

According to the exemplary embodiment, the suction cap 150 is configured to move in a top-bottom direction. The movement of the suction cap 150 in the top-bottom direction can be controlled by the controller 140. Specifically, the suction cap 150 is controlled by the controller 140 to lift the carrier glass sheet 11 while suction-holding the carrier glass sheet 11, thereby completely separating the carrier glass sheet 11 from the ultrathin glass sheet 12 suction-held by the suction plate 110. Here, the controller 140 may control the vacuum pump 130 to sequentially apply negative pressure to a plurality of suction caps 150 in the direction in which the debonding propagates.

According to the exemplary embodiment, the suction plate 110 may be configured to be movable in a horizontal direction. Thus, when the glass laminate 10 is seated on the top surface of the suction plate 110, the suction plate 110 is moved below the plurality of suction caps 150. When the debonding process is completed, the suction plate 110 may be returned to the initial position.

As illustrated in FIG. 13, the apparatus for supporting debonding according to the exemplary embodiment may further include a first tray 161, a second tray 162, a third tray 163, and a fourth tray 164 disposed around the suction plate 110. The glass laminate 10 to be debonded is placed in the first tray 161 before the debonding process. The debonded ultrathin glass sheets 12, i.e. the ultrathin glass sheets 12 separated from the carrier glass sheets 11, are sequentially loaded in the second tray 162. The debonded carrier glass sheets 11 are sequentially loaded in the third tray 163. In addition, a plurality of paper sheets are loaded in the fourth tray 164 before being supplied to the first tray 161, the second tray 162, and the third tray 163.

As described above, according to the exemplary embodiment, the glass laminate 10 is moved from the first tray 161 to the suction plate 110, the debonded ultrathin glass sheet 12 is moved from the suction plate 110 to the second tray 162, and the debonded carrier glass sheet 11 is moved from the suction plate 110 to the third tray 163. In addition, the sheets of paper are moved from the fourth tray 164 to the first tray 161, the second tray 162, and the third tray 163.

For the above-described movement of the glass laminate 10, the debonded ultrathin glass sheet 12, the debonded carrier glass sheet 11, and the sheets of paper, the apparatus for supporting debonding according to the exemplary embodiment may further include a gantry unit 170, as illustrated in FIG. 13.

The gantry unit 170 travels around the first to fourth trays 161 to 164 to transport the glass laminate 10, the debonded ultrathin glass sheet 12, the debonded carrier glass sheet 11, and the sheets of paper. The sequence and method of movement of the gantry unit 170 will be described in more detail later.

Hereinafter, the process of debonding a glass laminate using the apparatus for supporting debonding according to the exemplary embodiment will be described with reference to FIGS. 11 to 13. In the following description, for the components not illustrated in FIGS. 11 to 13, the remaining figures will be referred to.

A method of debonding a glass laminate according to an exemplary embodiment includes a locating step, a pressure application step, and a debonding step.

First, as illustrated in FIGS. 11 and 13, in the locating step, the glass laminate 10 is located in position on the top surface of the suction plate 110. Specifically, in the locating step, after the gantry unit 170 lifts the glass laminate 10 placed in the first tray 161, vision alignment is completed, and then the glass laminate 10 is located in position on the top surface of the suction plate 110. In the locating step, the glass laminate 10 is seated on the top surface of the suction plate 110 such that the ultrathin glass sheet 12 faces downward (in the drawings). Here, the glass laminate 10 is located in position such that the bottom surface of the carrier glass sheet 11 does not touch the top surface of the suction plate 110.

In the process of locating glass laminate 10 in position on the top surface of the suction plate 110, the device layers 13 protruding from one surface of the ultrathin glass sheet 12 are accommodated in the recesses 112 of the suction plate 110. Here, the plurality of suction cups 120 fitted to the plurality of suction holes 111a in the recesses 112 are in contact with the device layers 13 and are compressed by the contact pressure of the device layers 13. As a result, the ultrathin glass sheet 12 can maintain the flat plate shape thereof. Other portions of the one surface of the ultrathin glass sheet 12 without the device layers 13 is seated on the peripheral portion 113 and the ribs 114 of the suction plate 110. More specifically, the other portions of the one surface of the ultrathin glass sheet 12 without the device layers 13 is in contact with the plurality of suction cups 120 fitted to the plurality of suction holes 111b and 111c in the peripheral portion 113 and the ribs 114, and as a result, the entirety of the suction cups 120 are compressed.

Afterwards, in the pressure application step, negative pressure is applied to the plurality of suction cups 120 to suction-hold the glass laminate 10 located in position on the top surface of the suction plate 110. That is, the pressure application step applies negative pressure to the top surface of the suction plate 110 by controlling the vacuum pump 130 by the controller 140. Consequently, the glass laminate 10 is suction-held by the suction plate 110 and is supported on the top surface of the suction plate 110. Here, in the apparatus for supporting debonding according to the exemplary embodiment, a relatively low amount of suction force may be generated in the recesses 112 and a relatively high amount of suction force may be generated in the peripheral portion 113 and the ribs 114, regardless of uniform negative pressure being applied to the respective areas, since the concentration of the plurality of suction holes 111a in the recesses 112 may be different from the concentration of the plurality of suction holes 111b in the peripheral portion 113 and the ribs 114.

As described above, in the pressure application step, the glass laminate 10 is suction-held to the suction plate 110, and then the suction plate 110 is moved below the plurality of suction caps 150.

As the glass laminate 10 in the top position of the first tray 161 is moved to the suction plate 110 for the debonding process, a sheet of paper sandwiched between the uppermost glass laminates 10 loaded in the first tray 161 is exposed externally. According to the exemplary embodiment, the sheet of paper may be moved to the third tray 163, and a sheet of paper loaded in the fourth tray 164 may be moved to the second tray 162.

Afterwards, as illustrated in FIG. 12, in the debonding step, in the position in which the ultrathin glass sheet 12, located below, is suction-held by the suction plate 110, more particularly, to the plurality of suction cups 120, and the carrier glass sheet 11, located above, is suction-held by the plurality of suction caps 150, the carrier glass sheet 11 is debonded from the ultrathin glass sheet 12.

The debonding step is performed by suction-holding the carrier glass sheet 11 using the suction caps 150 and then lifting the carrier glass sheet 11 from one side to the other side. In the debonding step, portions of the carrier glass sheet 11, subjected to debonding, can be sequentially suction-held in the debonding propagation direction. Specifically, the debonding process can be easily performed by sequentially lifting suction caps 150, among the plurality of suction caps 150, disposed on portions of the carrier glass sheet 11 subjected to debonding, by applying negative pressure thereto.

After the carrier glass sheet 11 is completely separated from the ultrathin glass sheet 12 in this debonding step, negative pressure applied to the plurality of suction cups 120 may be released. In this manner, the debonding process for a single glass laminate 10 may be completed.

When the debonding process is completed, the ultrathin glass sheet 12 may remain suction-held by the suction plate 110, while the carrier glass sheet 11 may remain suction-held by the suction caps 150.

In some embodiments, in order to continuously perform the debonding process for another glass laminate 10, the suction plate 110 suction-holding the ultrathin glass sheet 12 is returned to the initial position, and then negative pressure applied to the ultrathin glass sheet 12 is released. Afterwards, the gantry unit 170 is operated to move the ultrathin glass sheet 12 to the second tray 162.

Afterwards, the suction plate 110, from which the ultrathin glass sheet 12 is removed, is moved below the plurality of suction caps 150, and then negative pressure applied to the suction caps 150 is removed, so that the carrier glass sheet 11, suction-held by the suction caps 150, is seated on the suction plate 110.

Subsequently, the suction plate 110, with the carrier glass sheet 11 being seated on the top surface thereof, is returned to the initial position. In addition, the carrier glass sheet 11 is moved to the third tray 163 by operating the gantry unit 170.

Afterwards, the debonding process for another glass laminate 10 is performed by repeating the above-described steps.

In addition, the ultrathin glass sheet 12 debonded from the carrier glass sheet 11 using the apparatus for supporting debonding according to the exemplary embodiment is cut in the process of converting the plurality of device layers 13 into individual panels.

The foregoing descriptions of specific exemplary embodiments of the present disclosure have been presented with respect to the drawings and are not intended to be exhaustive or to limit the present disclosure to the precise forms disclosed herein, and many modifications and variations would obviously be possible for a person having ordinary skill in the art in light of the above teachings.

It is intended, therefore, that the scope of the present disclosure not be limited to the foregoing embodiments, but be defined by the Claims appended hereto and their equivalents.

What is claimed is:

1. An apparatus for supporting a process of debonding a carrier glass sheet and an ultrathin glass sheet, bonded as a single glass laminate, the apparatus comprising:
    a suction plate comprising a plurality of suction hole portions defining suction holes for suction-holding a glass laminate seated thereon and at least one recess portion defining at least one recess accommodating at least one device layer protruding from one surface of an ultrathin glass sheet of the glass laminate;
    a plurality of suction cups fitted to the plurality of suction hole portions, respectively, such that the plurality of suction cups are elastically compressible, in response to contact pressure of the ultrathin glass sheet and the device layer;
    a vacuum pump connected to the plurality of suction hole portions to apply negative pressure to the plurality of suction hole portions; and
    a controller controlling the vacuum pump to adjust the negative pressure applied to the plurality of suction hole portions.

2. The apparatus of claim 1, wherein the at least one recess portion is disposed on a surface of the suction plate on which the glass laminate is seated, and
    the suction plate further comprises a peripheral portion surrounding the at least one recess portion on the surface of the suction plate on which the glass laminated is seated.

3. The apparatus of claim 1, wherein the at least one recess portion comprises a plurality of recess portions, the plurality of recess portions disposed on a surface of the suction plate on which the glass laminate is seated, and
    the suction plate further comprises a peripheral portion surrounding the plurality of recess portions, and a rib disposed between adjacent recess portions among the plurality of recess portions, on the surface of the suction plate on which the glass laminate is seated.

4. The apparatus of claim 3, wherein the suction plate comprises:
    a first flow path by which suction hole portions, among a plurality of suction hole portions provided in each recess portion among the plurality of recess portions, are connected, the first flow path being connected to the vacuum pump;
    a second flow path by which suction hole portions among the plurality of suction hole portions are connected, the second flow path being connected to the vacuum pump; and
    a third flow path by which suction hole portions among the plurality of suction hole portions provided in the rib are connected, the third flow path being connected to the vacuum pump.

5. The apparatus of claim 4, wherein the suction plate further comprises control valves disposed on the first flow path, the second flow path, and the third flow path, respectively.

6. The apparatus of claim 5, wherein the first flow path comprises a plurality of first flow paths provided in the plurality of recess portions, respectively, the plurality of first flow paths being controlled individually.

7. The apparatus of claim 1, wherein each of the plurality of suction cups comprises:
    a fixing portion fastened to an inner circumferential surface of a corresponding suction hole portion among the plurality of suction hole portions, with a first hole portion extending in a longitudinal direction of the fixing portion; and
    an operating portion coupled to a top end of the fixing portion to protrude from a top surface of the suction plate, with a second hole portion extending in a longitudinal direction of the operating portion to communicate with the first hole portion, the operating portion being elastically compressible in response to a contact pressure of the ultrathin glass sheet or the device layer.

8. The apparatus of claim 7, wherein an outer circumferential surface of the fixing portion is screw-engaged with the inner circumferential surface of the corresponding suction hole portion.

9. The apparatus of claim 8, wherein the operating portion comprises a bellows.

10. The apparatus of claim 1, wherein the glass laminate is configured such that a carrier glass sheet which is relatively thicker and wider than the ultrathin glass sheet is bonded to the ultrathin glass sheet while surrounding the ultrathin glass sheet.

11. The apparatus of claim 1, wherein a thickness of the ultrathin glass sheet ranges from 20 μm to 250 μm.

12. The apparatus of claim 1, further comprising at least one suction cap disposed on a carrier glass sheet of the glass laminate after the glass laminate is seated on the suction plate.

13. The apparatus of claim 12, wherein the at least one suction cap is connected to the vacuum pump controlled by the controller to suction-hold the carrier glass sheet using negative pressure applied by the vacuum pump.

14. The apparatus of claim 13, wherein the at least one suction cap is configured to be movable in a top-bottom direction to lift the carrier glass sheet under control of the controller, thereby detaching the carrier glass sheet from the ultrathin glass sheet.

15. The apparatus of claim 14, wherein the at least one suction cap comprises a plurality of suction caps, and
    the controller controls the vacuum pump to apply negative pressure to the plurality of suction caps sequentially in a debonding propagation direction.

16. The apparatus of claim 12, wherein the suction plate is movable in a horizontal direction.

17. The apparatus of claim 16, wherein the suction plate moves below the at least one suction cap after the glass laminate is seated thereon and returns to an initial position after debonding is finished.

18. The apparatus of claim 1, further comprising first to fourth trays disposed around the suction plate, wherein the glass laminate to be debonded is placed in the first tray, the debonded ultrathin glass sheet is placed in the second tray, the debonded carrier glass sheet is placed in the third tray, and a plurality of paper sheets are loaded in the fourth tray before being supplied to the first to third trays.

19. The apparatus of claim 18, further comprising a gantry unit traveling around the suction plate and the first to fourth trays to transport the glass laminate, the debonded ultrathin glass sheet, the debonded carrier glass sheet, and the plurality of paper sheets.

\* \* \* \* \*